(12) United States Patent
Mizutani et al.

(10) Patent No.: US 7,144,685 B2
(45) Date of Patent: Dec. 5, 2006

(54) METHOD FOR MAKING A PATTERN USING NEAR-FIELD LIGHT EXPOSURE THROUGH A PHOTOMASK

(75) Inventors: Natsuhiko Mizutani, Tokyo (JP); Yasuhisa Inao, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/393,988

(22) Filed: Mar. 31, 2006

(65) Prior Publication Data
US 2006/0166112 A1 Jul. 27, 2006

Related U.S. Application Data

(62) Division of application No. 10/423,938, filed on Apr. 28, 2003, now Pat. No. 7,050,144.

(30) Foreign Application Priority Data

| May 7, 2002 | (JP) | ............................. 2002-131887 |
| Apr. 17, 2003 | (JP) | ............................. 2003-112889 |

(51) Int. Cl.
  *G03F 7/20* (2006.01)
  *G03F 7/40* (2006.01)
  *G03F 1/00* (2006.01)
(52) U.S. Cl. ............................. 430/311; 430/313; 430/5
(58) Field of Classification Search ................ 430/311, 430/313
See application file for complete search history.

(56) References Cited

U.S. PATENT DOCUMENTS

| 6,187,482 B1 | 2/2001 | Kuroda et al. ................. 430/5 |
| 6,338,924 B1 | 1/2002 | Tsuruma et al. ................ 430/5 |
| 2001/0046719 A1 | 11/2001 | Yamaguchi et al. ............ 438/11 |

FOREIGN PATENT DOCUMENTS

| EP | 1 150 162 A2 | 10/2001 |
| JP | 8-179493 | 7/1996 |
| JP | 2000-314955 | 11/2000 |
| JP | 2001-5168 | 1/2001 |

*Primary Examiner*—S. Rosasco
*Assistant Examiner*—John Ruggles
(74) *Attorney, Agent, or Firm*—Fitzpatrick, Cella, Harper & Scinto

(57) ABSTRACT

A method of forming a latent image pattern in a photoresist film by providing a photomask for near-field light exposure that includes a transparent support and a shading member having a pattern of at least two apertures with different widths not greater than the wavelength of light from a light source. The shading member has a constant thickness that is set such that differences between light intensities directly below each of the apertures of different widths are 20% or less based on a largest light intensity of the light intensities directly below each of the apertures. The method includes placing the photomask on the photoresist film and irradiating with light from the light source. For manufacturing a semiconductor device, the method further includes developing a photoresist pattern from the latent image in the photoresist film on a silicon substrate and transferring the photoresist pattern onto the silicon substrate by etching.

2 Claims, 11 Drawing Sheets

METHOD FOR MAKING A PATTERN USING NEAR-FIELD LIGHT EXPOSURE THROUGH A PHOTOMASK

This application is a divisional application of U.S. patent application Ser. No. 10/423,938, filed Apr. 28, 2003, now U.S. Pat. No. 7,050,144 issued May 23, 2006.

BACKGROUND OF THE INVENTION

1. Field of the Invention

The present invention relates to photomasks for near-field light exposure, methods for making patterns using the photomasks, and apparatuses for making patterns including the photomasks.

2. Description of the Related Art

Higher resolution in photolithography is essential for progress in large-capacity semiconductor memories and high-speed, highly integrated CPUs. In general, the fine-patterning limits of photolithographic apparatuses are approximately the wavelengths of light rays emerging from light sources. Thus, near ultraviolet lasers are used as light sources of the photolithographic apparatuses to achieve fine lithographic processing with resolution on the order of 0.1 mm due to shorter wavelengths. For achieving a higher resolution of less than 0.1 mm, however, photolithography still has some unsolved problems, such as development of light sources that can emit shorter-wavelength light and development of lenses that can be used in this wavelength region.

Another type of micromachining apparatus for achieving a resolution of less than 0.1 mm includes a near-field optical microscope. In this apparatus, for example, a resist is exposed to evanescent light oozing out from a micro-aperture less than 100 nm at a region that is smaller than the light wavelength limit. The lithographic apparatus including the near-field optical microscope has the disadvantage of low throughput because micromachining is performed with one or several processing probes with a single stroke.

A countermeasure for improving the throughput is disclosed in Japanese Patent Laid-Open No. 8-179493. In this method, a prism is provided for a photomask. Light is incident on the prism under the total reflection condition, and the photomask pattern is transferred to the resist at a time using evanescent light oozing out from the total reflection surface. In the exposure apparatus using the evanescent light, however, the thickness of a shading film of the mask must be as thin as possible.

Another near-field light exposure mask is disclosed in Japanese Patent Laid-Open No. 2001-5168. This patent publication points out that the thickness of the shading film of the mask must be several tens of nm, and that the upper limit of the thickness of the shading film provided on a flat mask substrate is 50 nm. Thus, a substrate of the mask disclosed in this patent publication has grooves on which shading films are formed.

However, these known technologies do not disclose or suggest the dependence of the light intensity right below the aperture on the thickness of the shading film and the width of the aperture formed in the shading film, although they suggest some thickness information on the shading film of the photomask for near-field light exposure, as described above.

When a complicated pattern of fine apertures having different widths is provided in the mask, the near-field intensity varies with the width of each aperture of the mask. Thus, it is difficult to find a condition for exposing different positions through the apertures with the same light exposure. Even if the condition is found, the tolerance thereof is narrow.

Furthermore, the near-field of the fine aperture is affected by the aperture width; hence, a variation in width of fine apertures causes a change in size of the resist pattern formed by the exposure. Thus, such a variation must be suppressed. In addition, the near-field intensity would be lower than the intensity of the propagating light in the near-field mask exposure; hence, a mask structure that can utilize the near-field light with the maximum efficiency is required.

SUMMARY OF THE INVENTION

An object of the present invention is to provide a photomask for near-field light exposure that assures required light intensity right below an aperture of a shading member.

Another object of the present invention is to provide a method for making a pattern using the photomask.

Another object of the present invention is to provide an apparatus for making a pattern including the photomask.

A photomask for near-field light exposure according to the present invention includes a transparent substrate, and a shading member on the substrate, the shading member having a mask pattern including an aperture with a width not greater than the wavelength of light from a light source, wherein the shading member has a thickness that provides a required light intensity right below the aperture in consideration of a relationship with the width of the aperture.

Preferably, the mask pattern includes at least two apertures having different widths, and the thickness in the shading member is determined such that the difference in light intensity right below the apertures is 20% or less.

Preferably, the thickness of the shading member is determined such that the light intensity right below the aperture is a local maximum or a local minimum with respect to a variation in width of the aperture.

Preferably, the thickness of the shading member is determined such that the rate of change in light intensity to a minute variation of the width of the aperture is 2%/nm or less. Alternatively, the thickness of the shading member is controlled such that the light intensity right below the aperture having a predetermined width has a local maximum or resides in the range of 50% to less than 100% of the local maximum.

A method for making a pattern includes the steps of placing the above-described photomask for near-field light exposure on a work substrate provided with a photoresist film having a thickness that is less than the wavelength of light from the light source, and irradiating the back face of the photomask with the light from the light source for a predetermined period of time to form a latent image in the photoresist film by transferring an aperture pattern of the photomask.

An apparatus for making a pattern includes the above-described photomask for near-field light exposure, a stage that holds the photomask, the light source, a sample table that holds a work substrate provided with a photoresist film having a thickness that is less than the wavelength of light from the light source, and a unit for controlling the distance between the work substrate and the photomask.

Further objects, features and advantages of the present invention will become apparent from the following description of the preferred embodiments (with reference to the attached drawings).

DESCRIPTION OF THE PREFERRED EMBODIMENTS

The photomask for near-field light exposure of the present invention provides required light intensity right below an aperture of a shading member. This photomask, the method for making a pattern using the photomask, and the apparatus for making the pattern including the photomask have been completed based on the following results of intensive study by the inventors.

When the photomask is irradiated with light from a light source, a propagation mode is excited within a fine aperture that is provided in the shading film and has a width less than the wavelength of the light from the light source. The propagation constant, namely, the wavelength of the propagation mode depends on the width of the fine aperture. The light of this propagation mode is partly reflected by the interface between the fine aperture and the resist film. The reflected light reversely propagates through the fine aperture and is partly reflected by the interface between the fine aperture and a mask substrate. In other words, the fine aperture of the photomask functions as a resonator by reflection at these two ends. The inventors discovered that the light intensity right below the aperture in this resonator is represented by a function of both the length of the resonator corresponding to the thickness of the shading member and the width of the fine aperture.

First Embodiment

In the first embodiment, the thickness of the shading member is controlled within an appropriate range to reduce a difference in light intensity right below apertures having different widths to 20% or less, resulting in uniform light exposure of a resist disposed right below the apertures. Thus, a resist pattern including lines having different widths can be readily exposed at one time. The difference in light intensity of 20% or less is a requirement for a practical process control that can suppress variations in patterning process conditions such as exposure time and developing time caused by the photomask. The difference in light intensity is preferably 10% or less, and more preferably 0%.

Figure 1:
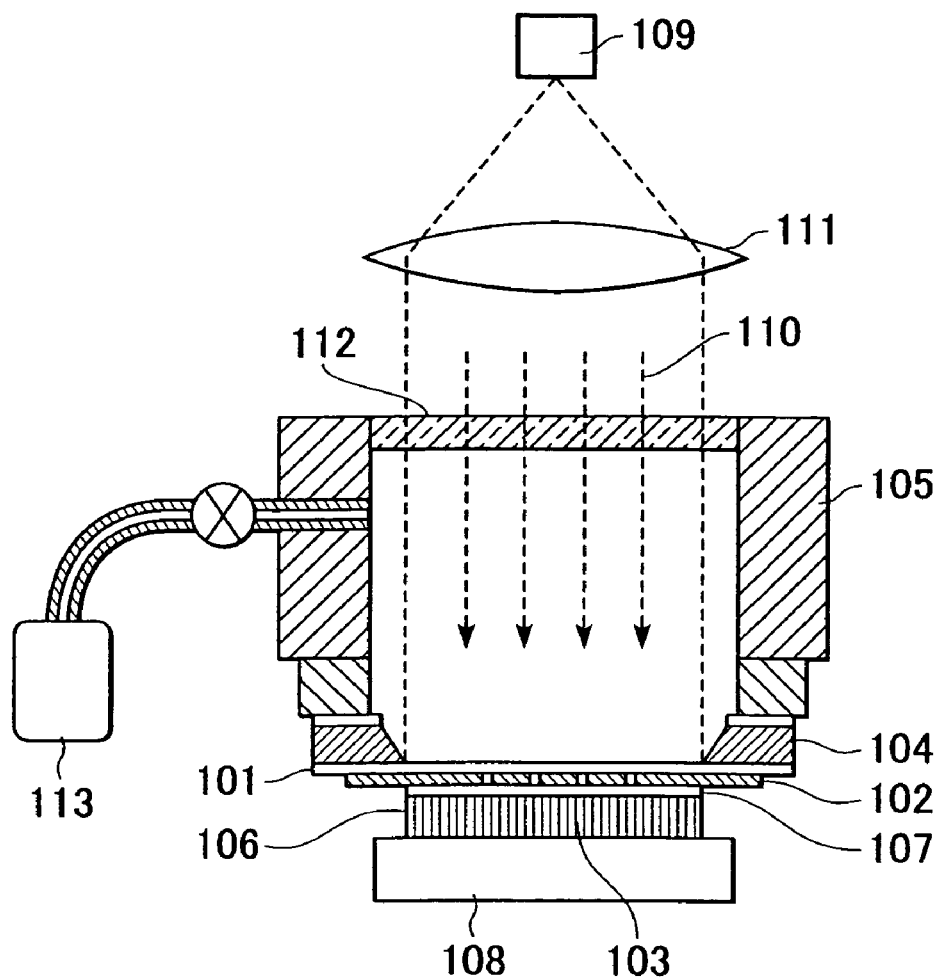
FIG. 1 is a schematic cross-sectional view of an aligner including a photomask for evanescent light exposure according to the present invention.
Figure 2:
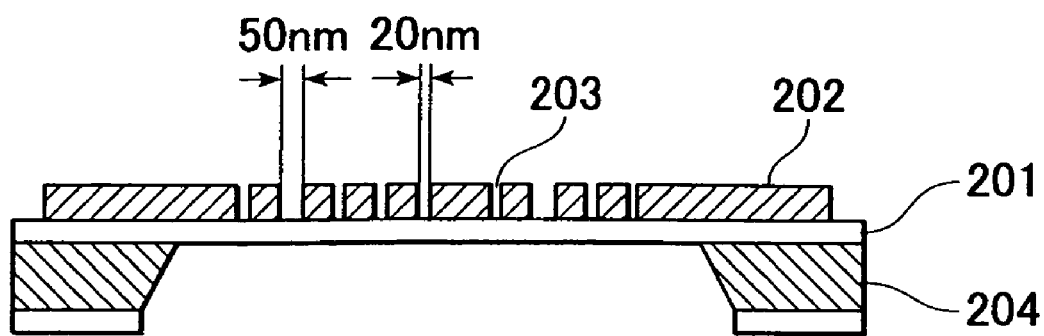
FIG. 2 is a cross-sectional view of a photomask according to a first embodiment and EXAMPLE 1 of the present invention.

The first embodiment will now be described in further detail with reference to the drawings. FIG. 2 is a cross-sectional view of a photomask in accordance with the first embodiment, and FIG. 1 is a schematic cross-sectional view of an aligner having the photomask for evanescent light exposure.

The photomask shown in FIG. 2 includes a transparent mask substrate 201 that transmits light from the light source and a metal film 202 with a thickness t thereon. The metal film 202 is provided with a pattern of fine apertures 203 having a width less than the wavelength of the light. The mask substrate 201 is composed of a thin film with a thickness in the range of 0.1 mm to 100 mm and is held on a support 204. As described below, the photomask is put into close contact with a thin film resist applied onto a substrate (corresponding to a substrate 106 in FIG. 1), and the resist is exposed with light that is vertically incident on the resist to form the pattern.

The behavior of the light in the vicinity of the mask will now be described in detail. The light that propagates through each fine aperture 203 in the metal film 202 of the shading film in the propagation mode is partly reflected by the interface of a resist film (not shown) in close contact with the fine aperture 203. The reflected light reversely propagates through the fine aperture 203 in the propagation mode and is reflected by the interface between the fine aperture 203 and the mask substrate 201. Each fine aperture 203 of the photomask functions as a resonator by reflection at these two ends. The length of the resonator is defined by the thickness t of the shading film. In other words, the thickness of the shading film is an important parameter that determines optical characteristics of the photomask. The wavelength of the propagation mode in the fine aperture depends on the width of the fine aperture; hence, the width of the fine aperture is another important parameter.

In order to investigate the optical characteristics of such a fine aperture in detail, the following model was subjected to numerical analysis on the electromagnetic field by a multiple multipole method. An infinite number of fine apertures with a width w were arranged at a pitch 1 of 150 nm. The light source was the i line with a wavelength of 365 nm. The mask substrate was composed of silicon nitride (SiN) with a refractive index of 1.9, the resist film had a complex refractive index of 1.7–0.008i, and the chromium metal film had a complex refractive index of 1.40192–3.25694i. The thickness t of the chromium film was varied. The edge of each fine aperture was rounded with a curvature radius of 5 nm.

The following discussion includes the results of the vector component of the electric field of the incident light in a direction perpendicular to the longitudinal direction of the fine slit aperture. The intensity component of the light polarized in the longitudinal direction is at least two digits smaller than that in the perpendicular direction right below the shading film and substantially does not contribute to exposure.

Figure 5:
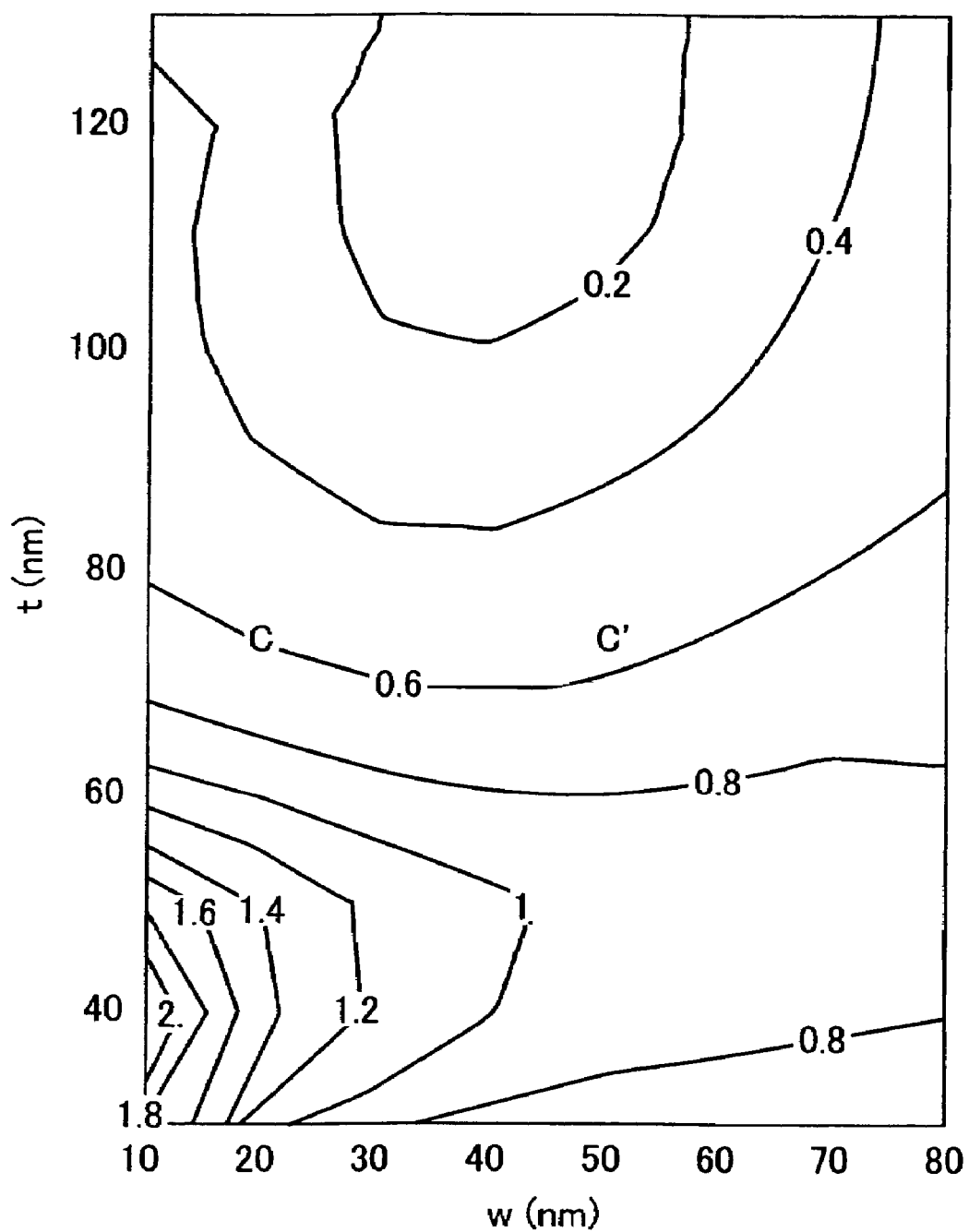
FIG. 5 is a graph of calculated average light intensity right below a fine aperture according to the first embodiment and EXAMPLE 1.

FIG. 5 is a contour map of the average light intensity right below the fine aperture 203 (2 nm distant from the fine aperture 203) represented by a function of the width w of the fine aperture and the thickness t of the shading film. The intensity was normalized by the amplitude of the incident plane waves. The map shows that the peak of the light intensity at a given aperture width w of 10 nm to 80 nm is within a thickness t of 40 nm to 50 nm.

On the other hand, at a constant thickness t in the range of 50 nm to 120 nm, the light intensity becomes a local minimum when the width w of the fine aperture is about 40 nm.

If there are two apertures having different widths (w1 and w2), one having a large width w2 greater than the width at the local minimum light intensity, the other having a small width w1 less than the width at the local minimum light intensity, the light intensities of these two apertures are substantially identical to each other or are within a predetermined range. For example, for w1=20 nm and w2=50 nm, the average near-field intensities right below the mask at a chromium film thickness of 70 nm are substantially equal to each other for these apertures, as represented by both ends of line C–C' shown in FIG. 5 (C corresponding to w1 and C' corresponding to w2).

When the wavelength of the light from the light source, the material for the metal film, the width of the fine apertures, and/or the refractive index of each layer is varied, the thickness of the metal film can also be optimized by the same simulation. For example, FIG. 6 shows the results of the calculation at a wavelength of 436 nm, wherein the refractive index of the SiN mask substrate was 1.9, the complex refractive index of the resist film was 1.7–0.008i, and the complex refractive index of the chromium metal film was 1.77544–4.03481i.

Figure 6:
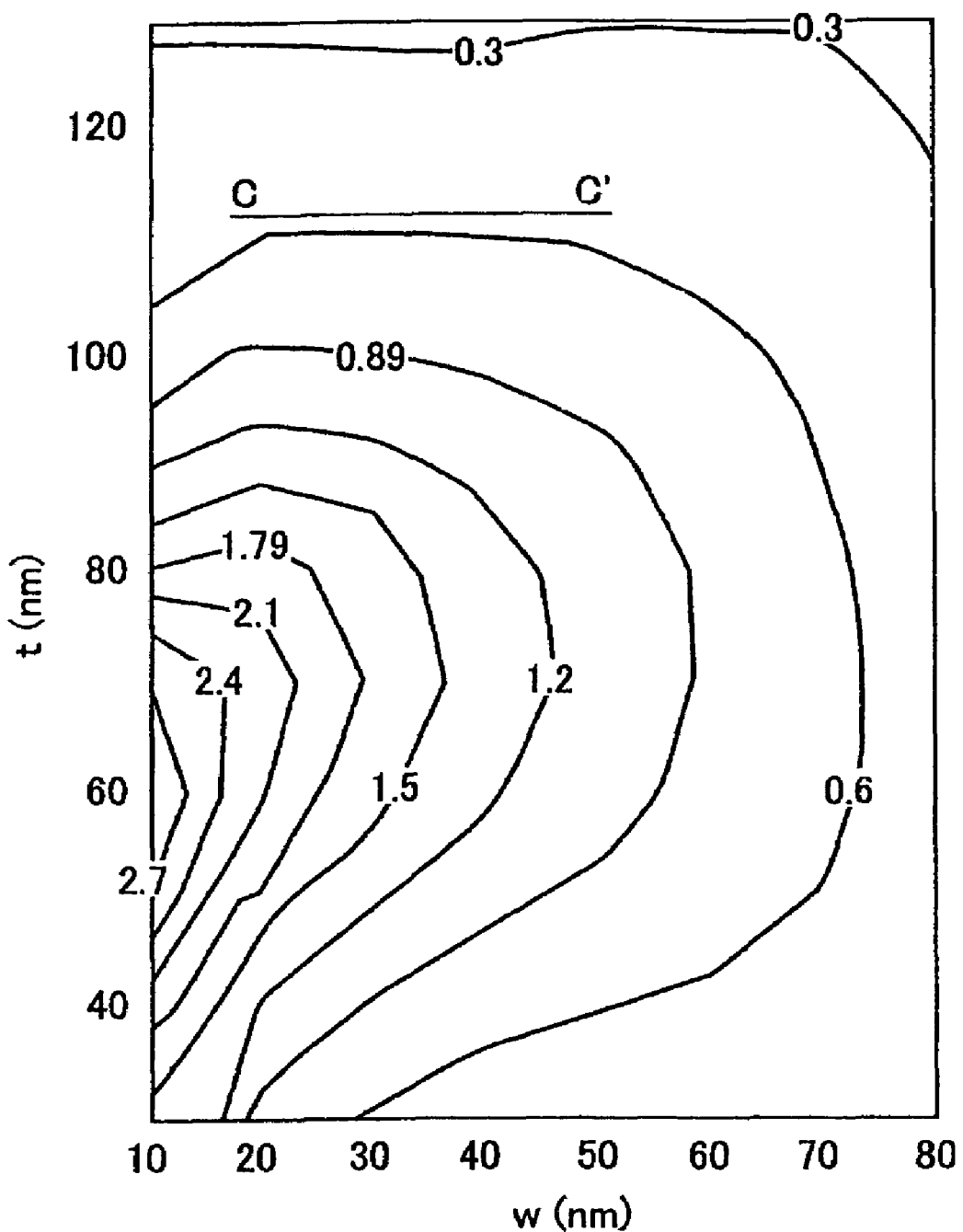
FIG. 6 is a graph of calculated average light intensity right below a fine aperture according to the first embodiment and EXAMPLE 1.

FIG. 6 shows that the light intensity has a local maximum when the width w of the aperture is varied at a constant thickness t in the range of 80 nm to 120 nm. In FIG. 6, the width w at the local maximum slightly shifts with the thickness within the range of about 20 nm to about 40 nm. The thicknesses t corresponding to line C–C' in FIG. 6 has the same effect as that described with reference to FIG. 5. At both ends of line C–C' shown in FIG. 6 (C corresponding to w1 (20 nm) and C' corresponding to w2 (50 nm)), the local light intensity is the same. Thus, the thickness 110 nm of the mask film corresponding to line C–C' in FIG. 6 is available to obtain the same light intensity with different two aperture widths of 20 nm and 50 nm.

Second Embodiment

As described above, the fine aperture with reflectors at the two ends functions as a resonator in the photomask, and the wavelength of the propagation mode in the fine aperture depends on the width of the fine aperture. Thus, the transmitted light volume and the light intensity right below the aperture in the resonator is represented by a function of the ratio of the resonator length to the shading film thickness and the width of the fine aperture.

When the rate of change in the light intensity to the width of the aperture is controlled within the above range, the change in the light intensity right below the aperture can be suppressed. As a result, the change in size in the resist pattern can be suppressed. More specifically, the light intensity can be controlled within a variation of 2% or less when the aperture width varies by 1 nm. A change in light intensity is within 20% when the width of the fine aperture varies by 10 nm. The difference in light intensity of 20% or less is a requirement for a practical process control that can suppress variations in patterning process conditions such as exposure time and developing time caused by the photomask.

When the thickness of the shading member gives a minimum differential coefficient that is obtained by differentiation of the light intensity right below the aperture between the two ends of the aperture, this thickness of the shading member minimizes the change in light intensity due to the variation in the aperture width, as a preferred structure in the present invention. Alternatively, the mask thickness may be determined as follows: A rate of change in light intensity to the variation in the aperture width is selected such that an increase in size in the resist pattern due to an increase in the aperture width is offset by a decrease in light intensity. The mask thickness is determined such that this rate of change is equal to the above differential coefficient.

Figure 3:
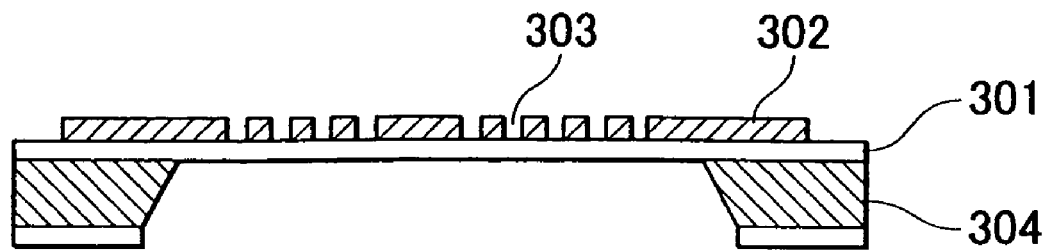
FIG. 3 is a cross-sectional view of a photomask according to a second embodiment and EXAMPLE 2 of the present invention.

The second embodiment of the present invention will now be described in detail with reference to the drawings. FIG. 3 is a cross-sectional view of an evanescent light exposure mask according to the second embodiment. This mask is also applicable to the aligner shown in FIG. 1, as is the mask shown in FIG. 2. In FIG. 3, a chromium thin film 302 with a thickness of 60 nm is formed on a mask substrate 301, which is transparent for the exposure light wavelength. The chromium thin film 302 has a pattern 303 of fine apertures with a width of 30 nm. The mask substrate 301 has a thickness in the range of 0.1 mm to 100 mm and is held by a support 304.

The second embodiment will now be described with reference to FIG. 7, which is the same as FIG. 5, which shows the results of the calculation in the first embodiment. For a width w of the aperture in the range of 10 mm to 80 nm, the peak of the light intensity resides at a thickness t between 40 nm and 50 nm. For example, referring to point A in FIG. 7, the near-field intensity is maximized at a thickness t of the chromium film of 45 nm for a width w of the fine aperture of 30 nm. At point A, the variation dI/dw of the light intensity I by a change in the thickness w is 0.025/nm when the amplitude of the incident plane waves is 1.

Referring now to point B, the variation dI/dw of the light intensity I by a change in the thickness w is reduced to 0.008/nm at a thickness t of the chromium film of 60 nm, although the near-field intensity decreases to 75% of the maximum. In such a case, a requirement for precision of the mask processing is moderated.

Figure 7:
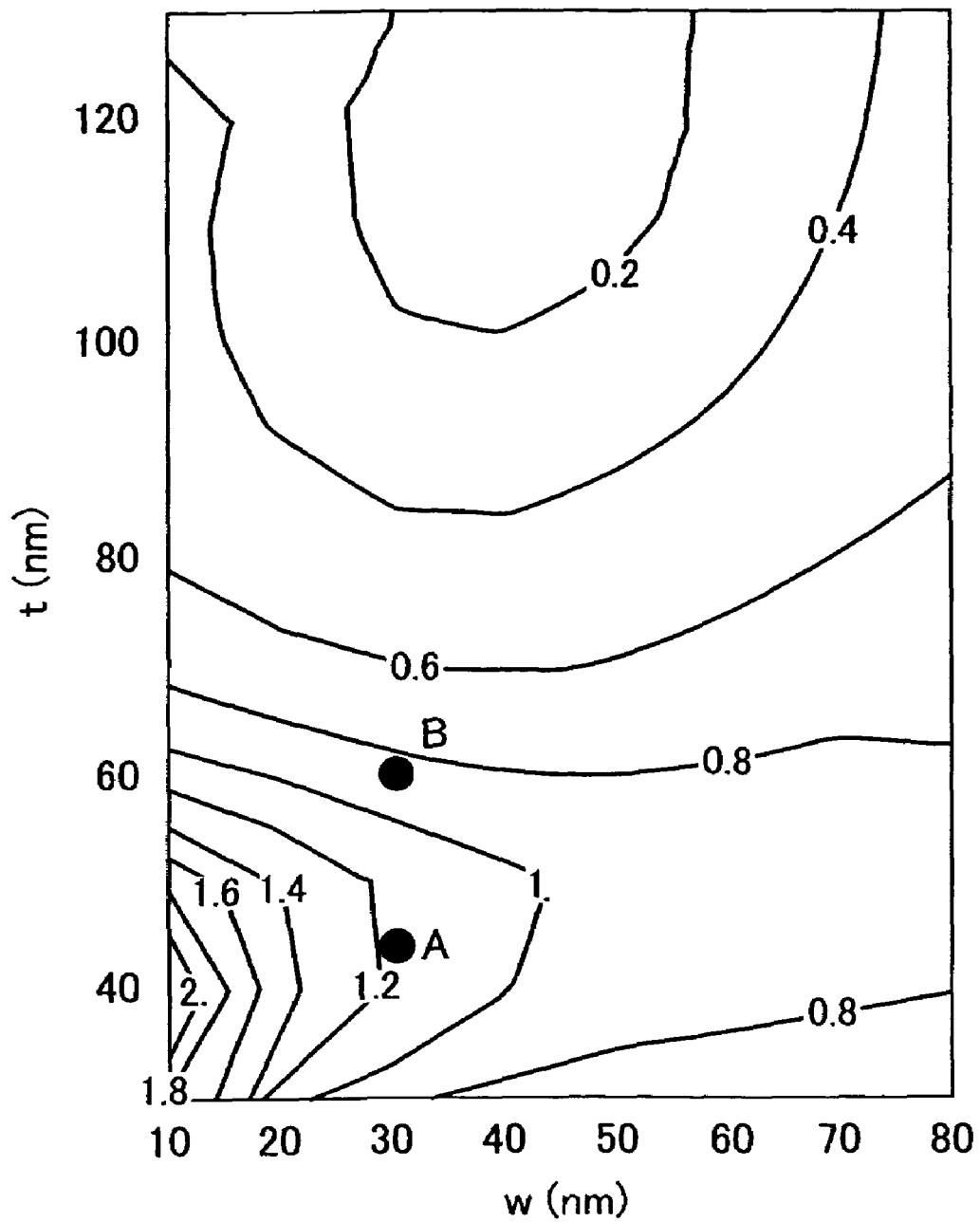
FIG. 7 is a graph of calculated average light intensity right below a fine aperture according to the second embodiment and EXAMPLE 2.
Figure 8:
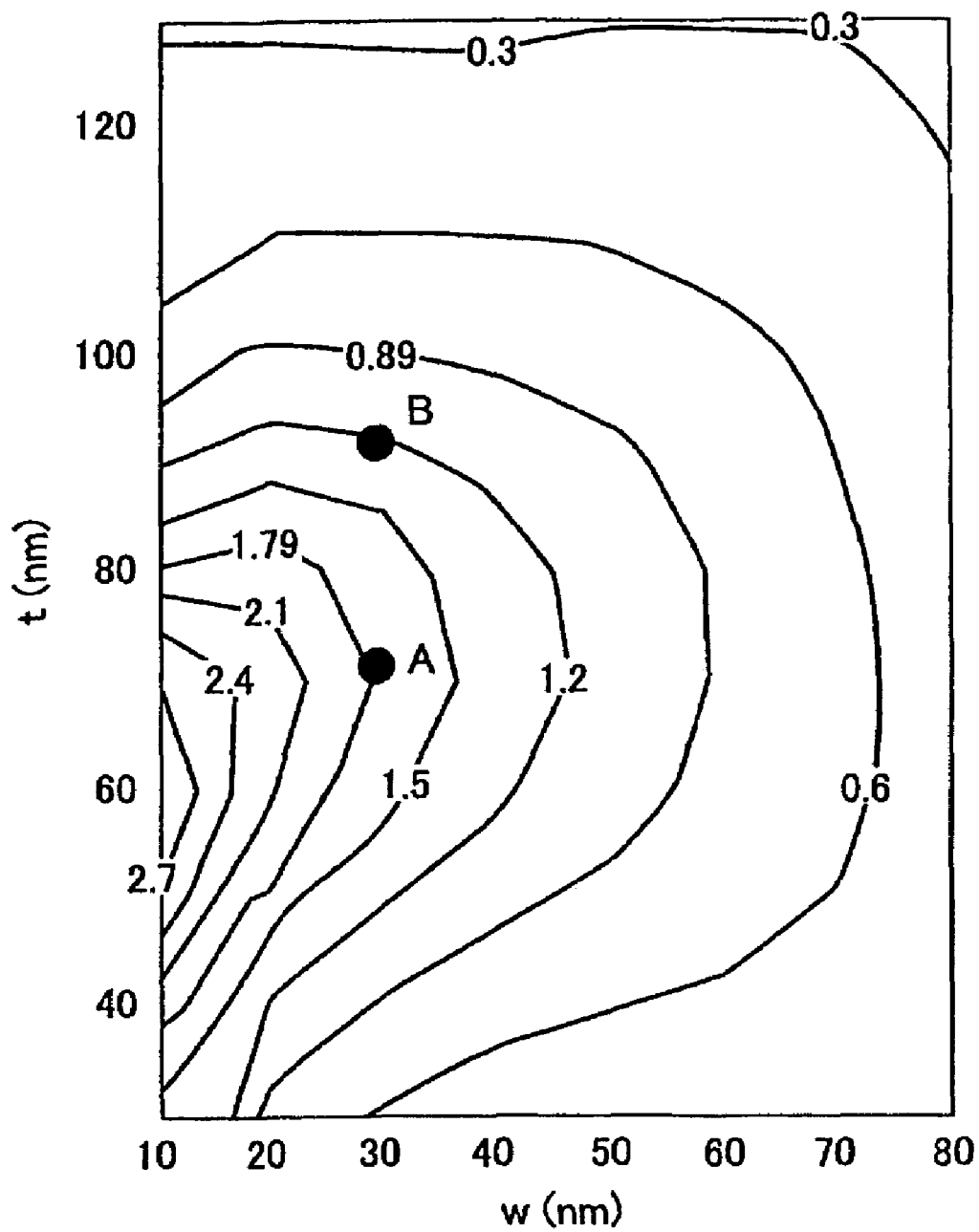
FIG. 8 is a graph of calculated average light intensity right below a fine aperture according to the second embodiment and EXAMPLE 2.

FIG. 8 shows the same results as those shown in FIG. 6. The thicknesses corresponding to points A and B in FIG. 8 have the same effect as those in FIG. 7.

Third Embodiment

As described above, the fine aperture with reflectors at the two ends functions as a resonator in the photomask, and the wavelength of the propagation mode in the fine aperture depends on the width of the fine aperture. The length of the resonator corresponds to the thickness of the shading member. The light intensity right below the aperture is represented by a function of the thickness of the shading member and is a local maximum. With reference to the local maximum intensity, 0%-less to 50%-less light intensity may be used for exposure for achieving a large light volume right below the aperture and a sufficiently reduced light volume at the shading portion. Herein, "50%-less light intensity" represents a 50% reduction in the light intensity, and is a requirement for a practical process control that can suppress variations in patterning process conditions such as exposure time and developing time caused by the photomask.

Furthermore, the rate of change in the light intensity to the thickness of the shading member is small in the vicinity of the mask thickness causing the local maximum; hence, the thickness of the shading member has a larger tolerance for achieving a required light intensity. As a result, the mask can be readily prepared. As described above, the thickness of the shading member is controlled such that the light intensity right below the aperture with a predetermined width is a local maximum or resides in the range of 50% to less than 100% of the local maximum, so that the mask may have a relatively large tolerance in thickness during the production process while ensuring a light intensity required for exposure.

Figure 4A:
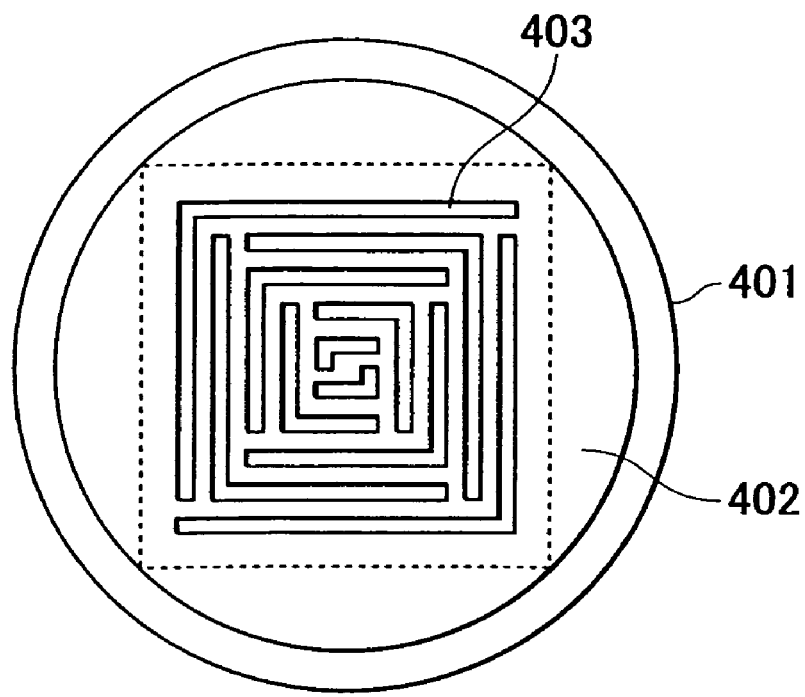
FIGS. 4A and 4B are a front plan view and a cross-sectional view, respectively, of a photomask according to a third embodiment and EXAMPLE 3 of the present invention.
Figure 4B:
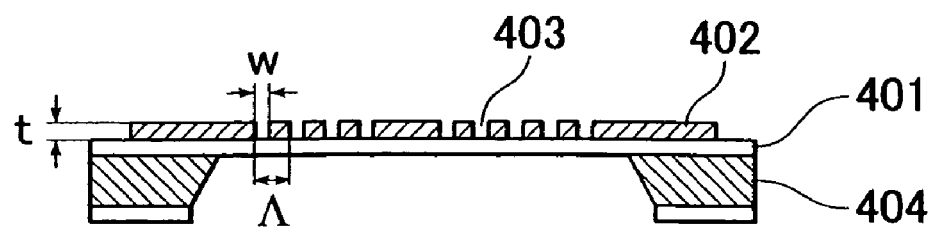

The third embodiment will now be described in further detail with reference to the drawings. FIG. 4A is a plan view of the photomask according to the third embodiment. This photomask is also applicable to the aligner shown in FIG. 1, as in the masks shown in FIGS. 2 and 3. In FIGS. 4A and 4B, a metal film 402 with a thickness t is provided on a mask substrate 401 that is transparent for the light from the light source. The metal film 402 has a pattern 403 of fine apertures with a width w that is less than the wavelength. The mask substrate 401 is composed of a thin film with a thickness of 0.1 mm to 100 mm and is held by a support 404.

The third embodiment will now be described with reference to FIG. 9, which is the same as FIG. 8, which shows the results of the calculation in the second embodiment. Within the width range of the aperture from 10 nm to 80 nm, for example, the peak of the light resides at point A corresponding to a thickness of 70 nm for a width w of 30 nm. Thus, the near-field intensity is maximized by controlling the chromium film thickness to 70 nm, which corresponds to point A in FIG. 9. Referring to line B–B' in FIG. 9, within the chromium film thickness range from 40 nm to 100 nm, the average light intensity is 50% or more of the maximum value.

Figure 9:
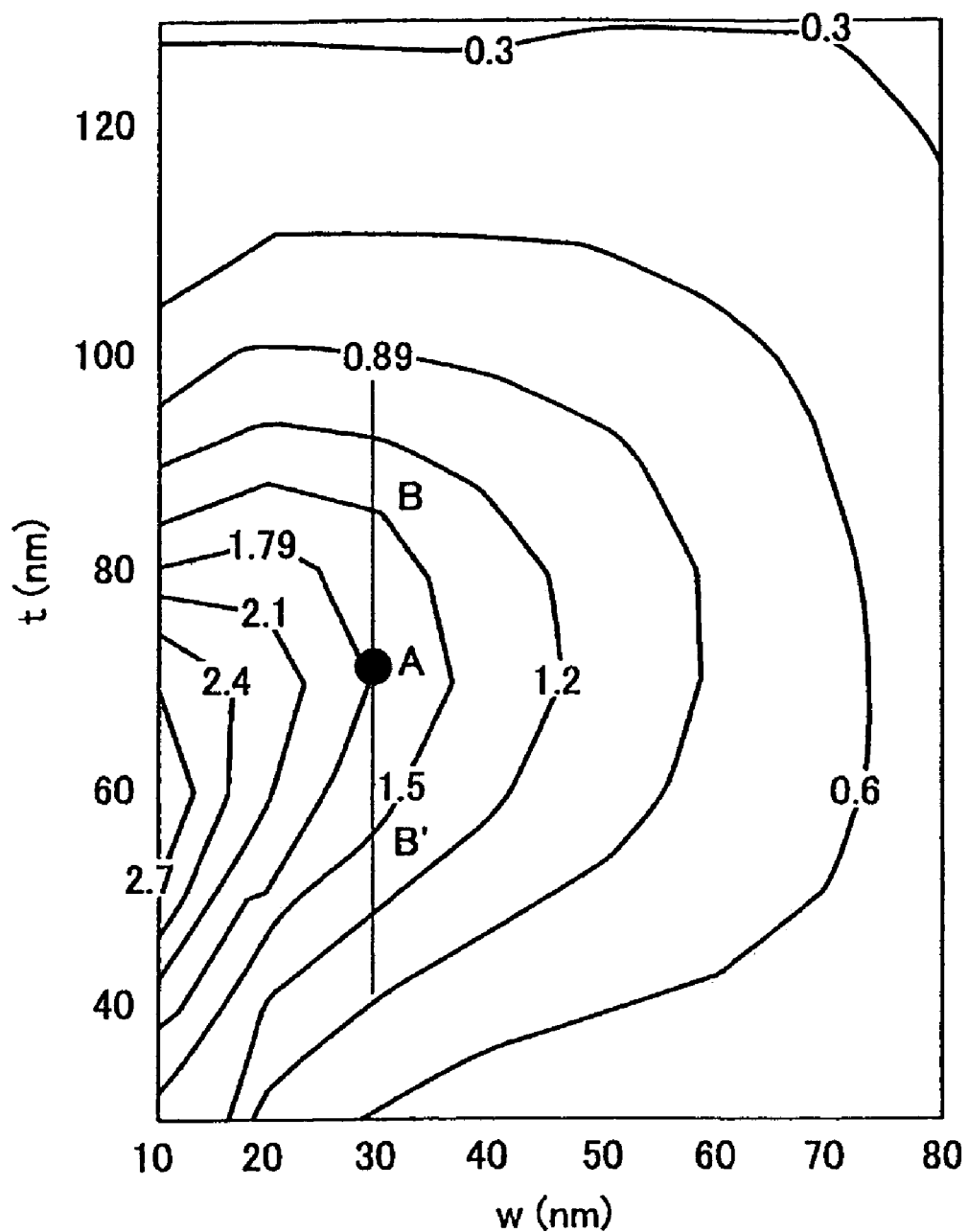
FIG. 9 is a graph of calculated average light intensity right below a fine aperture according to the third embodiment and EXAMPLE 3.
Figure 10:
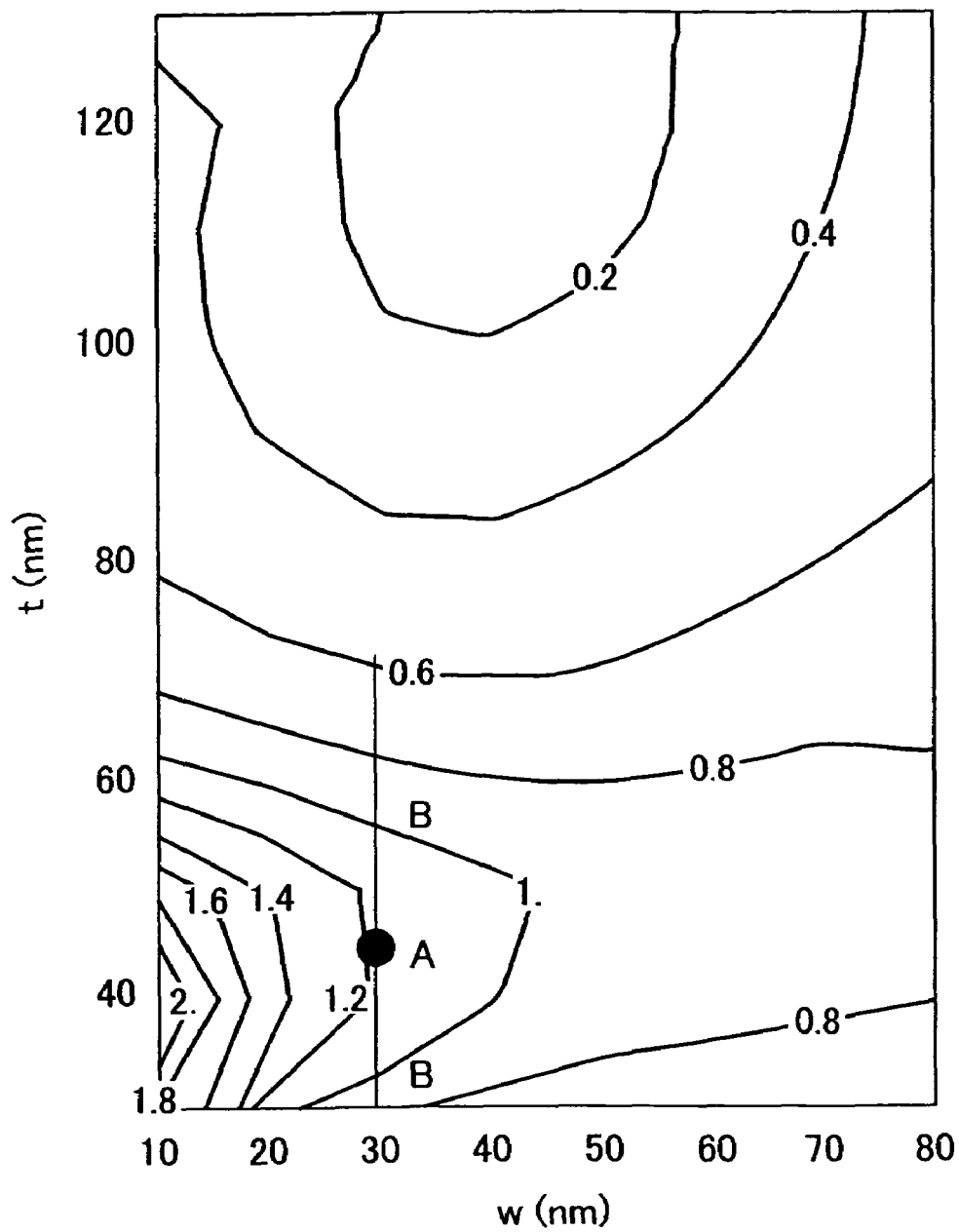
FIG. 10 is a graph of calculated average light intensity right below a fine aperture according to the third embodiment and EXAMPLE 3.

FIG. 10 shows the same results shown in FIG. 7. The thicknesses corresponding to points B and B' in FIG. 10 have the same effect as those in FIG. 9. In FIG. 7, since the light intensity at point B is 75% of the local maximum light intensity at point A, point B in FIG. 7 resides on line B–B' in FIG. 10. In FIG. 8, since the light intensity in point B is 66% of the local maximum light intensity at point A, point B in FIG. 8 resides on line B–B' in FIG. 9. In other words, the mask with the film thickness and the aperture width corresponding to point B shown in FIG. 8 also belong to the third embodiment. Thus, the thickness of the shading member has a larger tolerance for achieving a required light intensity. Furthermore, as described in the second embodiment, the rate of change in light intensity to the variation in the aperture width is 2%/nm or less; hence, this mask also has a large tolerance for the variation in the aperture width.

FIG. 9 shows that the rate of change in light intensity with the variation in the aperture width is smaller at position B than at position B' on line B–B' corresponding to a light intensity that is 50% or more of the local maximum intensity, although the reason for this phenomenon is still unclear. Thus, it is preferable for reducing the rate of change in light intensity to the variation of the aperture width that the thickness be larger than that at point A causing the maximum light intensity. That point B in FIG. 8 resides on line B–B' in FIG. 9 satisfies a preferred condition in the present invention.

According to the present invention, the photomask for near-field light exposure of the present invention provides a required light intensity right below the aperture of the shading member. Furthermore, the method for making a pattern using the photomask and the apparatus for making the pattern including the photomask have been completed.

When two or more apertures having different widths are provided, the thickness of the shading member is controlled such that a difference in light intensity right below these apertures is in the range of 0% to 20%. As a result, a difference in near-field light intensity per unit area right below these apertures is reduced. This facilitates simultaneous exposure of a resist pattern having different line widths and formation of a complicated pattern.

Even if the aperture width shifts from a designed value during the mask-processing step, the variation in light intensity right below the apertures can be suppressed. Thus, the resist pattern formed has a small variation in size. Thus, a requirement for precision of the mask processing is moderated. Accordingly, the mask can be readily produced.

When the thickness of the shading film is determined such that the light intensity right below the aperture with a predetermined thickness is maximized, the exposure time can be reduced. Thus, the aligner can be placed in a moderated environment with respect to vibration and temperature. Furthermore, the shading member may have an increased tolerance with respect to the thickness in the mask production process; hence, the mask can be readily produced.

EXAMPLES according to the present invention will now be described.

EXAMPLE 1

An evanescent light exposure mask shown in FIG. 2 was formed. A chromium thin film 202 with a thickness of 70 nm was formed on a mask substrate 201 which was transparent for the exposure light. The chromium thin film 202 had a pattern 203 of fine apertures, some having a line width of 20 nm and the others having a line width of 50 nm. The results of calculation based on the same model as that in the first embodiment are shown in FIG. 5. As shown by line C–C' in FIG. 5 (C corresponding to w=20 nm, C' corresponding to w=50 nm), the same intensity was achieved right below the aperture with the width of 20 nm and the aperture with the width of 50 nm, though the light intensity was the half or less of the maximum at a chromium film thickness of 70 nm. Since the apertures having different widths can be exposed under the same condition, a satisfactory resist pattern can be produced using a complicated mask pattern having two different aperture widths.

EXAMPLE 2

An evanescent light exposure mask shown in FIG. 3 was formed. A chromium thin film 302 with a thickness of 60 nm was formed on a mask substrate 301 which was transparent for the exposure light. The chromium thin film 302 had a pattern 303 of fine apertures having a width of 30 nm. The mask substrate 301 was composed of a thin film with a thickness of 0.1 mm to 100 mm and was held by a support 304. The results of calculation based on the same model as that in the second embodiment are shown in FIG. 7. FIG. 7 shows that the near-field intensity is maximized at a thickness of the chromium film of 45 nm when the aperture width is 30 nm, and the variation in average light intensity right below the aperture is 0.025 as the fine aperture width varies by 1 nm. According to EXAMPLE 2, when the thickness is 60 nm, the variation in the average light intensity is reduced to 0.008 or less for a variation of the aperture width of 1 nm, although the light intensity is reduced to ¾ of the maximum. Even if the opening width varies during the mask production process, the variation in the light intensity is slight. Thus, the mask has an increased size tolerance.

EXAMPLE 3

An evanescent light exposure mask shown in FIGS. 4A and 4B was formed. FIG. 4A and FIG. 4B are a top view and a cross-sectional view, respectively, of the mask. A chromium thin film 402 with a thickness of 70 nm was formed on a mask substrate 401 which was transparent for the exposure light. The chromium thin film 402 had a pattern 403 of fine apertures having a width of 30 nm. The thickness (70 nm) of the chromium film 402 was determined such that the near-field light intensity was maximized on the front face of the mask when the g line with a wavelength of 436 nm was used as the light source, under the model used in the third embodiment with reference to FIG. 9. The mask substrate 401 was held by a support 404.

EXAMPLE 4

Figure 11A:
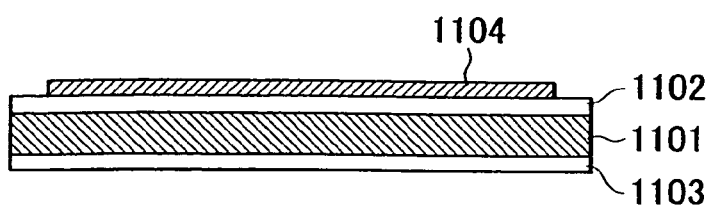
FIGS. 11A to 11D are cross-sectional views illustrating the steps of making a photomask according to EXAMPLE 4.

A method for making a photomask will now be described with reference to FIGS. 11A to 11D. Referring to FIG. 11A, an $Si_3N_4$ film 1102 with a thickness of 0.8 mm was formed on the polished front face (upper face in the drawings) and an $Si_3N_4$ film 1103 with a thickness of 0.8 mm was formed and the polished back face (lower face in the drawings) of a Si(100) substrate 1101 with a thickness 500 mm by an LP-CVD process. A chromium thin film 1104 with a thickness of 70 nm was deposited on the $Si_3N_4$ film 1102 by a vapor deposition process under the control by a thickness monitor including a quartz resonator.

Figure 11B:
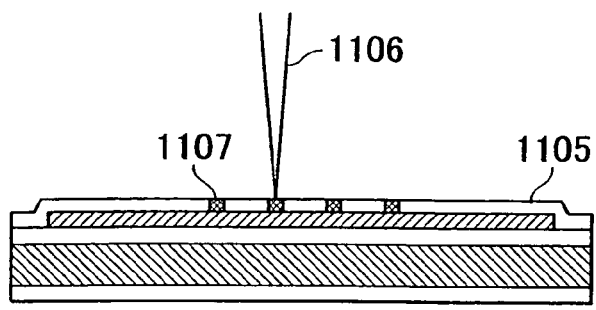
Figure 11C:
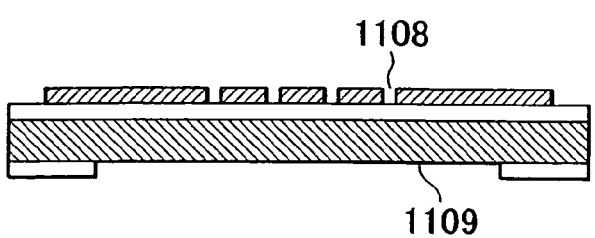
Figure 11D:
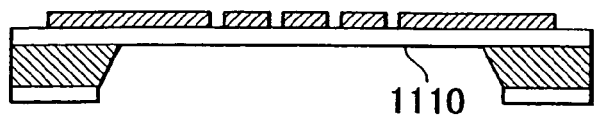

An electron-sensitive resist 1105 was applied on the upper face and was patterned by electron beams 1106 to form a pattern 1107 with a line width of 20 nm and a line width of 50 nm (FIG. 11B). After developing, the pattern was etched with carbon tetrachloride to form a fine aperture pattern 1108 (FIG. 11C). The $Si_3N_4$ film 1103 at the back face was partly removed to form a window 1109 for etching (FIG. 11C). The Si substrate 1101 was subjected to etching from the back face with potassium hydroxide (KOH) to form a mask 1110 composed of the $Si_3N_4$ film 1102 as a mask substrate and the etched fine aperture pattern 1108 in the chromium film 1104 as a mask pattern (FIG. 11D).

In EXAMPLE 4, the fine aperture pattern 1108 was formed in the chromium thin film 1104 by electron beams. The patterning may be performed by any other method, for example, focused ion beam processing, x-ray lithography, or scanning probe microscopic (SPM) processing. Among these, SPM processes, such as a scanning tunneling microscopic (STM) process, an atomic force microscopic process, and a scanning near-field optical microscopic (SNOM) process enables the formation of an ultrafine aperture pattern with a width of 10 nm or less. Thus, the SPM process is very suitable for the present invention.

EXAMPLE 5

An aligner including the evanescent light exposure mask of EXAMPLE 5 will now be described with reference to FIG. 1. The front face (lower face in FIG. 1) of the photomask 101 is at the exterior of a pressure-regulating container 105, and the back face (upper face in FIG. 1) is at the interior of the pressure-regulating container 105. The pressure in the pressure-regulating container 105 is controlled by pressure-regulating means 113.

An object composed of a substrate 106 with a resist 107 was exposed. The substrate 106 with the resist 107 was placed on a stage 108. The stage 108 is driven to align the substrate 106 to the photomask 101 in the two-dimensional direction along the mask plane. The stage 108 was driven along the normal line of the photomask 101 to put the photomask 101 into contact with the resist 107 on the substrate 106. The pressure in the pressure-regulating container 105 was controlled by the pressure-regulating means 113 so that the distance between the front face of the photomask 101 for evanescent light exposure and the resist 107 was 100 nm or less over the entire region.

The exposure light 110 emerging from a light source 109 was collimated by a collimating lens 111 and was introduced into the pressure-regulating container 105 through a glass window 112. The collimated light reached the back face (upper face in FIG. 1) of the photomask 101, so that the resist 107 was irradiated with the evanescent light oozing out from the fine aperture pattern 104 on the front face of the photomask 101.

The resist 107 may be composed of any photoresist used in general semiconductor processes. These photoresists are generally sensitive to light with a wavelength in the range of 200 nm to 500 nm. A variety of photoresists sensitive to the g line or the i line within the range of 350 nm to 450 nm are available at relatively low prices, thus resulting in high process flexibility and low process costs.

The light source 109 must emit light with which the resist 107 can be exposed. When a photoresist sensitive to the g line or the i line is used as the resist 107, the usable light sources 109 are, for example, a HeCd laser (wavelength: 325 nm, 442 nm), a GaN-based blue semiconductor laser (wavelength: to 410 nm), the second harmonic generation (SHG) and the third harmonic generation (THG) of an infrared laser, and a mercury lamp (g line: 436 nm, i line: 365 nm).

The driving voltage and current and the irradiation time of the light source 109 are controlled for adjusting the light volume of the exposure. In this example, the g line (436 nm) of the mercury lamp was used, and the light was collimated through a wavelength selection filter and a collimator lens to irradiate a region of 100 mm by 100 mm. While the optical power was monitored with a power meter, the exposure time was determined so that the exposure volume of the resist exceeded an exposure threshold. Since the exposure is performed through the photomask, the exposure volume must be controlled in consideration of the transmittance of the mask.

EXAMPLE 6

Figure 12A:
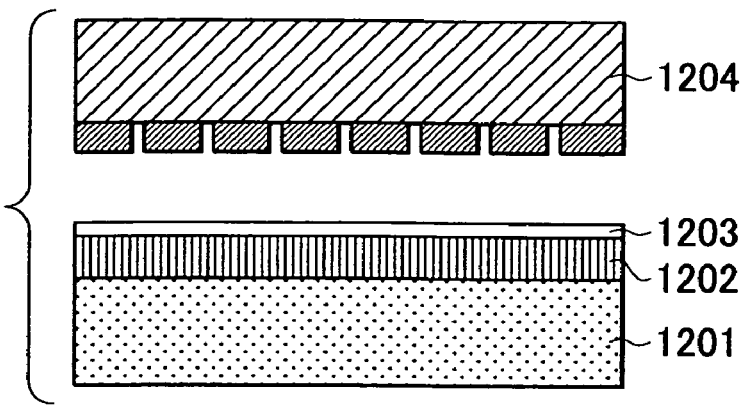
FIGS. 12A to 12D are cross-sectional views illustrating the steps of making a pattern according to EXAMPLE 6.

A method for making a pattern including a buffer layer will now be described with reference to FIGS. 12A to 12D. Referring to FIG. 12A, a photomask 1204 may be any type shown in the above EXAMPLES. A positive photoresist was applied onto a silicon substrate 1201 with a spin coater and was heated at 120° C. for 30 minutes to form a first layer 1202 with a thickness of 400 nm. A silicon-containing negative photoresist was applied onto the first layer 1202, and was prebaked to form a second layer 1203 with a thickness of 40 nm. A double-layer photoresist was thereby formed on the silicon substrate 1201.

Figure 12B:
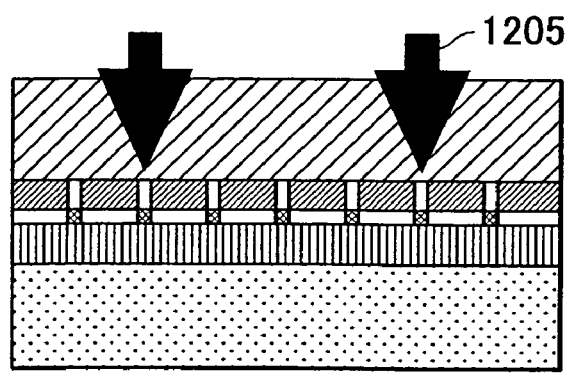
Figure 12C:
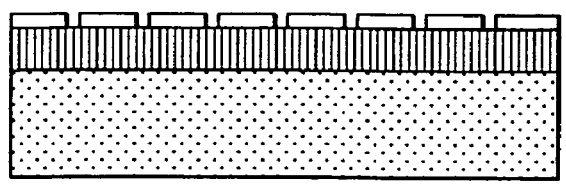

The photomask 1204 was put into contact with this silicon substrate 1201 as shown in FIG. 1, and into tight contact with the substrate 1201 by pressure. The resist layer 1203 was exposed with light 1205 through the photomask 1204 to transfer the pattern of the photomask 1204 to the photoresist layer 1203, as shown in FIG. 12B (the photomask was prepared in consideration of the wavelength of the light 1205). The photomask was detached from the photoresist. The photoresist was developed and was postbaked to form a resist pattern that was transferred from the photomask pattern, as shown in FIG. 12C.

Figure 12D:
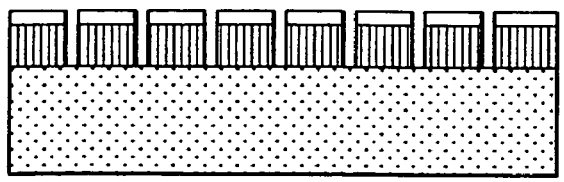

The first photoresist layer 1202 was etched by oxygen reactive ion etching through the second photoresist layer 1203 functioning as the etching mask, as shown in FIG. 12D. During the oxygen reactive ion etching, silicon contained in the second photoresist layer 1203 was oxidized to enhance the etching resistance of this layer. A variety of patterns of photomasks can be transferred onto the substrate 1201 with a high contrast in such a manner.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of forming a latent image pattern in a photoresist film, said method comprising the steps of:
   providing a photomask, for near-field light exposure, comprising a transparent support member and a shading member on the support member, the shading member having a constant thickness and a pattern of apertures with widths not greater than a wavelength of light from a light source, wherein the shading member includes at least two apertures of different widths, and the thickness of the shading member is set such that differences between light intensities directly below each of the apertures of different widths is 20% or less based on a largest light intensity of the light intensities directly below each of the apertures of different widths;
   placing the photomask on the photoresist film formed on a work substrate; and
   irradiating through the transparent support member and the pattern of apertures in the shading member of the photomask with the light from the light source to form a latent image pattern in the photoresist film based on the pattern of apertures on the photomask.

2. A method of manufacturing a semiconductor device, said method comprising the steps of:
   providing a photomask, for near-field light exposure, comprising a transparent support member and a shading member on the support member, the shading member having a constant thickness and a pattern of apertures with widths not greater than a wavelength of light from a light source, wherein the shading member includes at least two apertures of different widths, and the thickness of the shading member is set such that differences between light intensities directly below each of the apertures of different widths is 20% or less based on a largest light intensity of the light intensities directly below each of the apertures of different widths;
   placing the photomask on a photoresist film formed on a silicon substrate;
   irradiating through the transparent support member and the pattern of apertures in the shading member of the photomask with the light from the light source to form a latent image pattern in the photoresist film based on the pattern of apertures on the photomask;
   developing the photoresist film to form a photoresist pattern; and
   transferring the photoresist pattern onto the silicon substrate by etching.

* * * * *